United States Patent
Sekijima

(10) Patent No.: US 11,792,920 B2
(45) Date of Patent: Oct. 17, 2023

(54) CIRCUIT BOARD, SEMICONDUCTOR DEVICE AND METHOD OF MANUFACTURING CIRCUIT BOARD

(71) Applicant: SHINKO ELECTRIC INDUSTRIES CO., LTD., Nagano (JP)

(72) Inventor: Shinichiro Sekijima, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 14 days.

(21) Appl. No.: 17/740,777

(22) Filed: May 10, 2022

(65) Prior Publication Data
US 2022/0369454 A1    Nov. 17, 2022

(30) Foreign Application Priority Data

May 13, 2021   (JP) .................................. 2021-081908

(51) Int. Cl.
| | |
|---|---|
| H05K 1/02 | (2006.01) |
| H05K 1/05 | (2006.01) |
| H05K 1/18 | (2006.01) |
| H01L 23/498 | (2006.01) |
| H05K 3/34 | (2006.01) |
| H01L 23/12 | (2006.01) |
| H05K 3/42 | (2006.01) |

(52) U.S. Cl.
CPC ........... *H05K 1/0266* (2013.01); *H01L 23/12* (2013.01); *H01L 23/49811* (2013.01); *H05K 1/05* (2013.01); *H05K 1/184* (2013.01); *H05K 3/3452* (2013.01); *H05K 3/42* (2013.01)

(58) Field of Classification Search
CPC ........ H05K 1/0266; H05K 1/05; H05K 1/184; H01L 23/12; H01L 23/49811
See application file for complete search history.

(56) References Cited

U.S. PATENT DOCUMENTS

| | | | | |
|---|---|---|---|---|
| 10,470,300 B1* | 11/2019 | Seki | .................... | H05K 1/0269 |
| 2004/0201097 A1* | 10/2004 | Ohsumi | .................. | H01L 24/10 |
| | | | | 257/E23.179 |
| 2008/0088038 A1* | 4/2008 | Hsu | ........................ | H01L 24/05 |
| | | | | 257/786 |

(Continued)

FOREIGN PATENT DOCUMENTS

| | | |
|---|---|---|
| JP | H06-177492 | 6/1994 |
| JP | 2007-258374 | 10/2007 |
| JP | 2012-074443 | 4/2012 |

*Primary Examiner* — Hoa C Nguyen
(74) *Attorney, Agent, or Firm* — Rankin, Hill & Clark LLP

(57) ABSTRACT

A circuit board includes an interconnect and an insulating layer that covers the interconnect. The interconnect includes a first interconnect that is formed to serve as a recognition mark of which planar shape is a predetermined shape. The insulating layer has a through-hole of which planar shape is variant and that penetrates the insulating layer in a thickness direction of the insulating layer such that an entire upper surface of the first interconnect is exposed. The through-hole includes a first through-hole of which planar shape is a predetermined shape and that penetrates the insulating layer in the thickness direction such that the entire upper surface of the first interconnect is exposed and a second through-hole that serves as part of an inner wall surface of the first through-hole and that penetrates the insulating layer in the thickness direction.

7 Claims, 16 Drawing Sheets

(56) References Cited

U.S. PATENT DOCUMENTS

| | | | |
|---|---|---|---|
| 2008/0284048 A1* | 11/2008 | Kim | H01L 24/11 |
| | | | 257/E23.179 |
| 2009/0102071 A1* | 4/2009 | Kindo | H01L 23/544 |
| | | | 257/E23.179 |
| 2012/0073862 A1 | 3/2012 | Muramatsu et al. | |
| 2012/0313265 A1* | 12/2012 | Yamanishi | H01L 25/105 |
| | | | 257/786 |
| 2014/0083747 A1* | 3/2014 | Matsuno | H01L 23/544 |
| | | | 174/251 |
| 2016/0172287 A1* | 6/2016 | Arisaka | H05K 1/181 |
| | | | 257/774 |
| 2022/0197069 A1* | 6/2022 | Oh | H05K 1/189 |

* cited by examiner

CIRCUIT BOARD, SEMICONDUCTOR DEVICE AND METHOD OF MANUFACTURING CIRCUIT BOARD

CROSS-REFERENCE TO RELATED APPLICATION

This application is based upon and claims the benefit of priority of the prior Japanese Patent Application No. 2021-081908, filed on May 13, 2021, the entire contents of which are incorporated herein by reference.

FIELD

The embodiment discussed herein is related to a circuit board, a semiconductor device and a method of manufacturing a circuit board.

BACKGROUND

For example, when a part to be mounted, such as a semiconductor chip, is mounted on a circuit board, the outermost layer of the circuit board is protected by an insulating material referred to as solder resist from attachment of solder, contamination, etc. In this case, in order to form pads necessary for connection to the part to be mounted, openings for exposing a circuit layer that is formed under the solder resist are formed.

FIG. 12 is a schematic plan view illustrating an example of a conventional circuit board 100 and an example of conventional recognition marks 103. The circuit board 100 illustrated in FIG. 12 includes a chip mount area 101 for mounting a semiconductor chip and a plurality of pads 102 in the chip mount area 101. The recognition marks (alignment marks) 103 that are used for positioning when the semiconductor chip is mounted on the chip mount area 101 are formed around the chip mount area 101. Openings 104A of which planar shape is circular are formed in a solder resist layer 104 that is formed on an insulating layer 105 and the recognition marks 103 are formed by a circuit pattern that is exposed from the openings 104A.

The planar shape of the recognition mark 103 is formed by the circuit pattern that contains a circular part 103A and a straight linear part 103B. The recognition marks 103 are formed around the chip mount area 101 in two spots on the diagonal line of the chip mount area 101 of the circuit board 100.

A mount device that mounts a semiconductor chip on the chip mount area 101 on the circuit board 100 identifies the recognition marks 103 at the two spots around the chip mount area 101 and, based on the positions of the identified recognition marks 103 at the two spots, identifies the position of the chip mount area 101. Furthermore, the mount device mounts the semiconductor chip on the recognized chip mount area 101. As a result, it is possible to identify the recognition marks 103 and arrange the semiconductor chip correctly in the chip mount area 101.

Patent Literature 1: Japanese Laid-open Patent Publication No. H6-177492
Patent Literature 2: Japanese Laid-open Patent Publication No. 2007-258374
Patent Literature 3: Japanese Laid-open Patent Publication No. 2012-74443

FIG. 13 is an illustrative view illustrating an example of an operation of recognizing border points Y of the conventional recognition mark 103. The mount device identifies the recognition mark 103 from above the circuit board 100 and identifies a plurality of border points Y between a circular part 103A and a straight line part 103B (circuit pattern) of the recognition mark 103 in the opening 104A of the solder resist layer 104 and an insulating layer 105 under the solder resist layer 104. As illustrated in FIG. 13, based on the identified border points Y, the mount device calculates a virtual circle and calculates the center of the virtual circle as the center of the recognition mark 103. Based on the calculated centers of the recognition marks 103 at the two spots around the chip mount area 101, the mount device identifies the position of the chip mount area 101. For the recognition mark 103, however, the virtual circle is calculated using the circuit pattern of the circular part 103A and the straight line part 103B and thus the accurate center of the recognition mark 103 is not calculated.

FIG. 14 is an illustrative view illustrating an example of a problem in an operation of recognizing the conventional recognition mark 103. When the position of the opening 104A of the solder resist layer 104 shifts, the circuit pattern of the circular part 103A and the straight line part 103B of the recognition mark 103 in the opening 104A is partly hidden by the solder resist layer 104. As a result, because the mount device is not able to identify part of the circuit pattern of the recognition mark 103, accuracy in identifying the recognition mark 103 lowers. Furthermore, the straight line part 103B of the recognition mark 103 is hidden by the solder resist layer 104 and only the circuit pattern of the circular part 103A of the recognition mark 103 is exposed in some cases. In that case, because the circular part 103A of the exposed recognition mark 103 is in a circular shape in the same size as that of the pad 102, there is a risk that the mount device recognizes the recognition mark 103 as the pad 102 by mistake.

The opening 104A that forms the recognition mark 103 could be not circular but rectangular or triangular. FIG. 15A is a schematic plan view illustrating an example of a conventional opening 104B and FIG. 15B is a schematic plan view illustrating an example of a conventional opening 104C. The opening size of the openings 104B and 104C has to be larger than that of the circular shape and, when the opening size is reduced, it is difficult to form a sharp opening. As a result, because the dimensional ratio of a straight line part X1 of the opening 104B and the opening 104C and a round part X2 that has a round edge is instable, the opening 104B and the opening 104C are not suitable as the opening 104A.

SUMMARY

According to an aspect of an embodiment, a circuit board includes an interconnect and an insulating layer that covers the interconnect. The interconnect includes a first interconnect that is formed to serve as a recognition mark of which planar shape is a predetermined shape. The insulating layer has a through-hole of which planar shape is variant and penetrates the insulating layer in a thickness direction of the insulating layer such that an entire upper surface of the first interconnect is exposed. The through-hole includes a first through-hole of which planar shape is a predetermined shape and a second through-hole. The first through-hole penetrates the insulating layer in the thickness direction such that the entire upper surface of the first interconnect is exposed. The second through-hole serves as part of an inner wall surface of the first through-hole and penetrates the insulating layer in the thickness direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An embodiment of a circuit board, a semiconductor device and a method of manufacturing the circuit board will be described in detail below with reference to the accompanying drawings. Note that the embodiment does not limit the disclosure.

Embodiment

Figure 1:
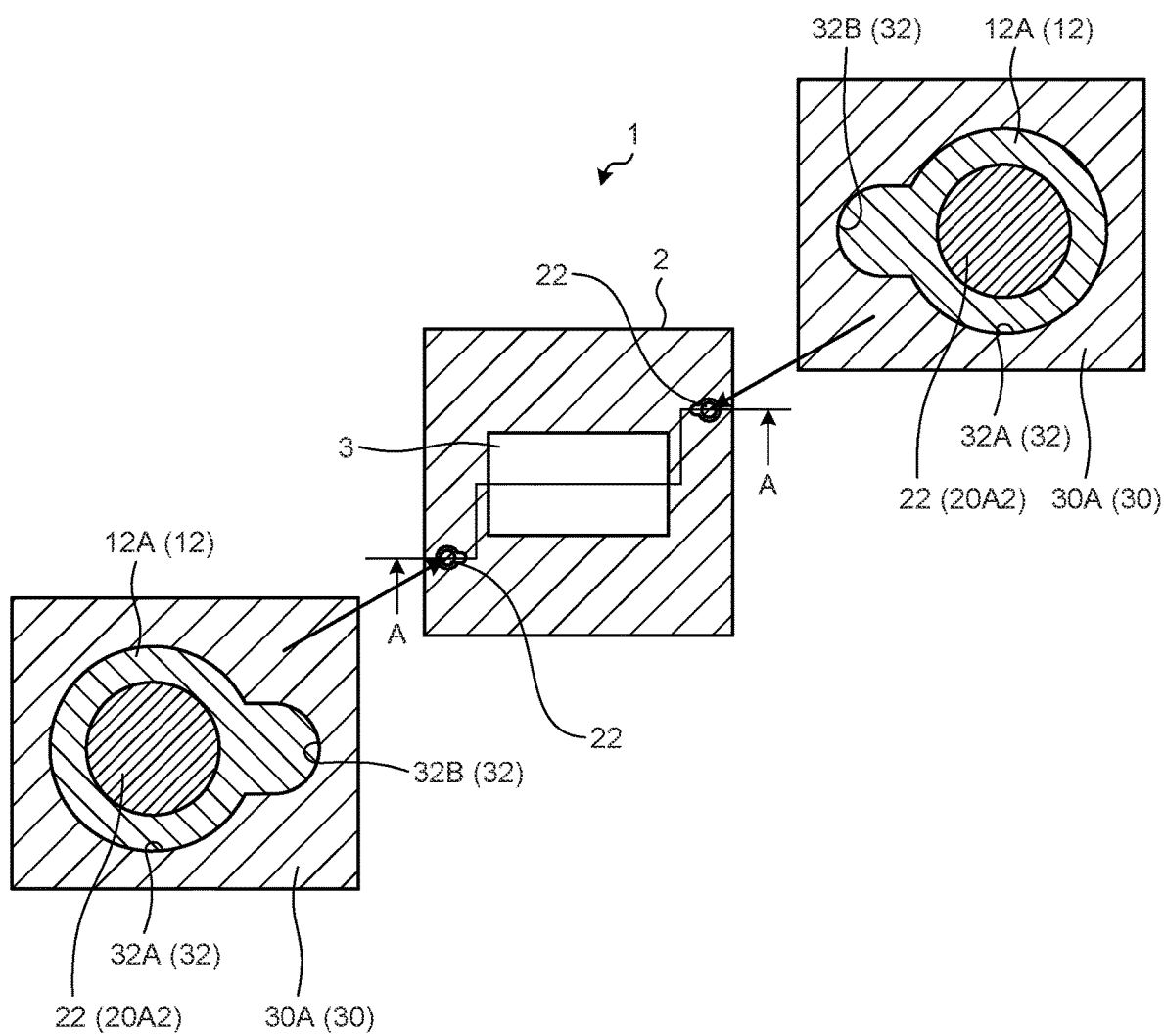
FIG. 1 is a schematic plan view illustrating an example of a semiconductor device and a recognition mark of an embodiment.
Figure 2:
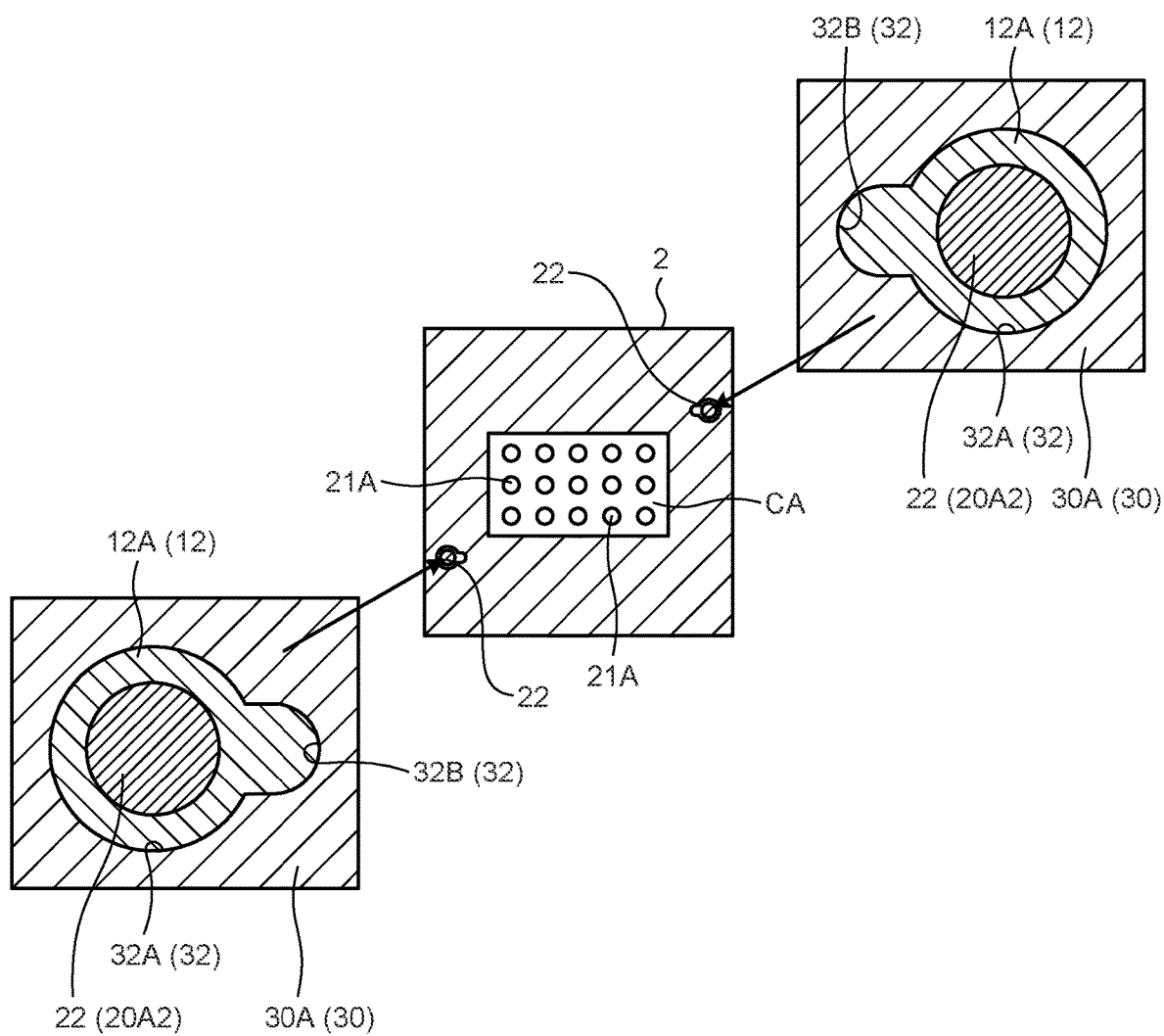
FIG. 2 is a schematic plan view illustrating an example of a circuit board and the recognition mark of the embodiment.
Figure 3:
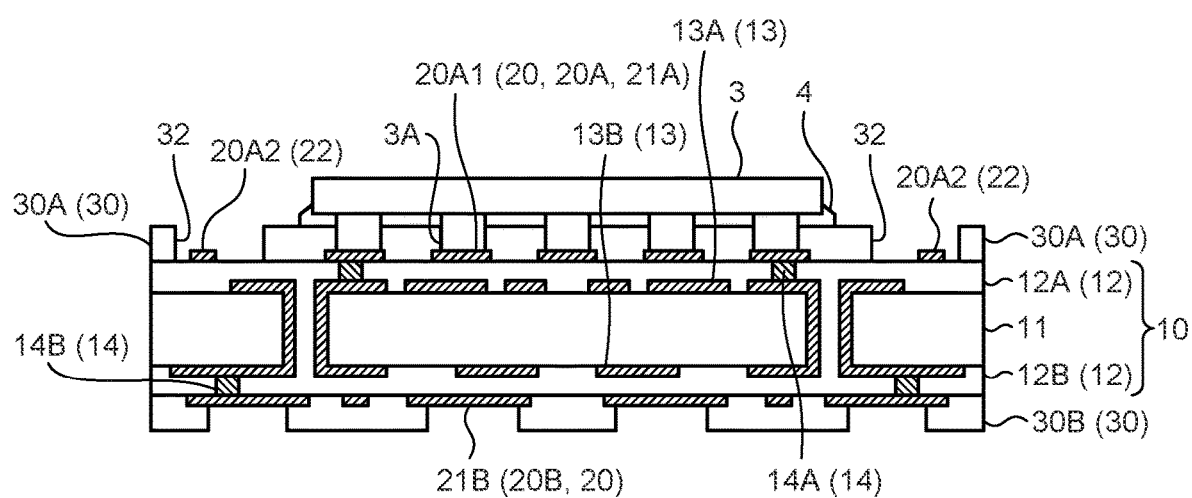
FIG. 3 is a schematic cross-sectional view of the semiconductor device illustrated in FIG. 1, taken along the line A-A.

FIG. 1 is a schematic plan view illustrating an example of a semiconductor device 1 and a recognition mark 22 of an embodiment, FIG. 2 is a schematic plan view illustrating an example of a circuit board 2 and the recognition mark 22 of the embodiment, FIG. 3 is a schematic cross-sectional view of the semiconductor device 1 illustrated in FIG. 1, taken along the line A-A.

The semiconductor device 1 illustrated in FIG. 1 and FIG. 3 includes the circuit board 2, a semiconductor chip 3, and an under fill resin 4. The circuit board 2 illustrated in FIG. 3 includes a board body 10, a circuit pattern 20A (20) that is a circuit (interconnect) of a top layer, a circuit pattern 20B (20) that is an interconnect of a bottom layer, a solder resist layer 30A (30) of the top layer, and a solder resist layer 30B (30) of the bottom layer. Note that the semiconductor chip 3 that is mounted on the circuit board 2 has a plurality of bumps 3A that are arranged in a matrix on a circuit formation surface of the semiconductor chip 3. The solder resist layer 30A is an insulating layer that covers the circuit pattern 20A that is the interconnect of the top layer. As illustrated in FIG. 3, the solder resist layer 30A is described as the top layer and the solder resist layer 30B is described as the bottom layer below, and the circuit board 2 may be used, for example, upside down or may be used in a predetermined posture.

The board body 10 illustrated in FIG. 3 includes a core substrate 11, a plurality of insulating layers 12 (12A, 12B), interconnects 13 (13A and 13B) that are formed in the insulating layers 12, and vias 14 (14A, 14B). The interconnects 13 and the vias 14 that are provided in the board body 10 electrically connect the circuit patterns 20A and 20B. Note that, for example, copper (Cu) is used as a material of the interconnects 13 and the vias 14. For example, insulating resin, such as epoxy resin or polyimide resin, is usable as a material of the insulating layers 12.

The circuit pattern 20A is provided on a chip mount surface side (an upper surface side in FIG. 3) of the board body 10 and includes a circuit pattern 20A1 and a circuit pattern 20A2. The circuit pattern 20A1 is a second interconnect serving as pads 21A to which the bumps 3A of the semiconductor chip 3 are connected. The planar shape of the circuit pattern 20A1 is, for example, circular.

The circuit pattern 20A2 is a first interconnect of which entire upper surface is exposed from the solder resist layer 30A and thus serves as the recognition mark 22. The planar shape of the circuit pattern 20A2 is, for example, circular as illustrated in FIG. 1. The circuit pattern 20A1 and the circuit pattern 20A2 in the circuit pattern 20A are formed in the same thickness. For example, copper is usable as a material of the circuit pattern 20A, that is, a material of the pads 21A and the recognition mark 22. Note that the circuit pattern 20A may be formed by applying necessary plating (such as nickel plating or gold plating) to the surface of the copper layer.

As illustrated in FIG. 3, the circuit pattern 20B is provided on a side (a lower surface side in FIG. 3) opposite to the chip mount surface of the board body 10. The circuit pattern 20B serves as pads 21B. Note that, for example, copper is usable as a material of the circuit pattern 20B.

The solder resist layer 30A is provided on the chip mount surface side of the board body 10 such that the solder resist layer 30A covers the circuit pattern 20A. For example, an insulating non-photosensitive resin, such as epoxy resin, is usable as a material of the solder resist layer 30A. In the solder resist layer 30A, a plurality of openings 31A for partly exposing the pads 21A that are the circuit pattern 20A1 and a through-hole 32 for exposing the entire upper surface of the recognition mark 22 that is the circuit pattern 20A2 is formed.

The opening 31A will be described. First of all, because the bumps 3A of the semiconductor chip 3 are provided in a matrix, the pads 21A are arranged in a matrix, too, in the chip mount area CA of the circuit board 2 (refer to FIG. 2) according to the mode of arrangement of the bumps 3A. For this reason, in the chip mount area CA in the solder resist layer 30A, the openings 31A are formed in a matrix. The planar shape of each of the openings 31A is circular like the pads 21A of the circuit pattern 20A1. Furthermore, the planar shape of each of the openings 31A is formed smaller than the planar shape of the pad 21A such that part of the pad 21A is exposed. Because of the openings 31A, part of the circuit pattern 20A1 is exposed from the solder resist layer 30A as the pads 21A.

Figure 4:
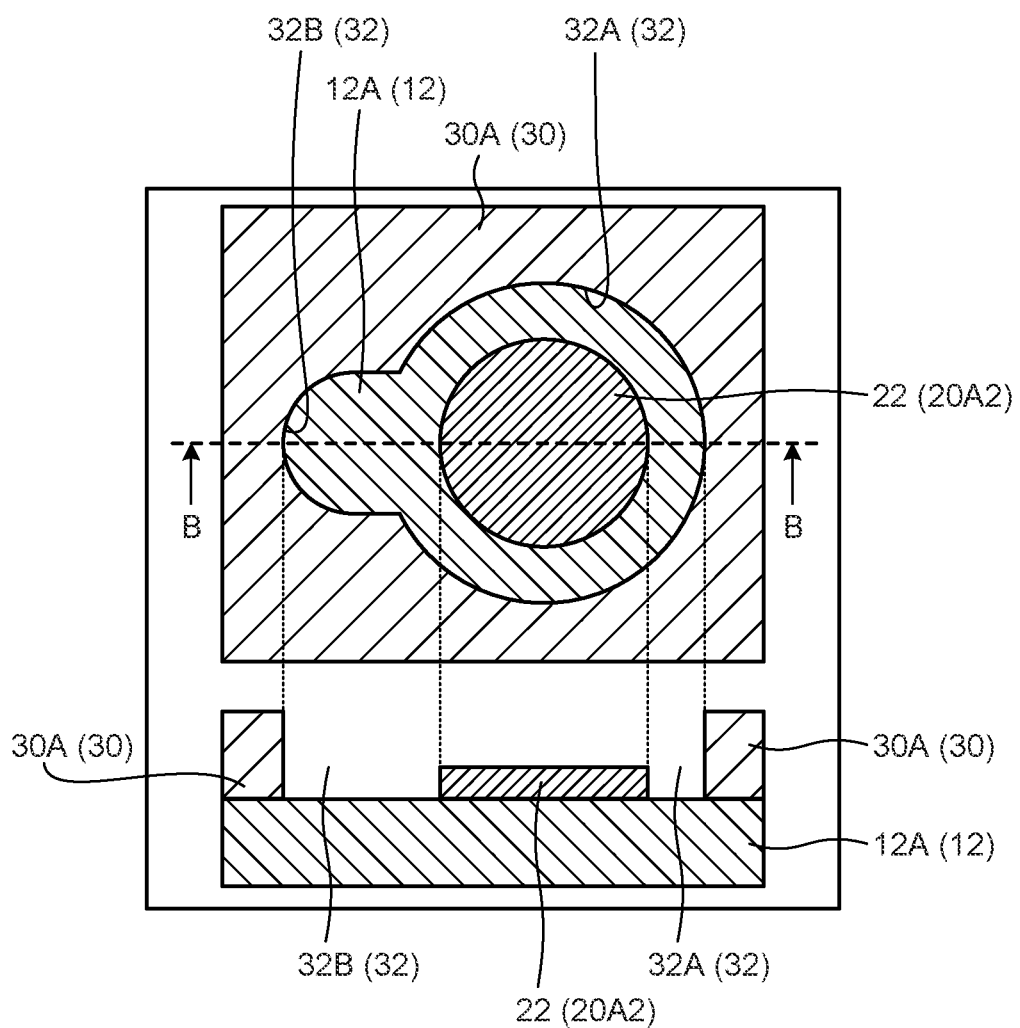
FIG. 4 is a plan view illustrating an example of the recognition mark and a schematic cross-sectional view of the recognition mark, taken along the line B-B.

The through-hole 32 will be described. FIG. 4 is a plan view illustrating an example of the recognition mark 22 and a schematic cross-sectional view of the recognition mark 22, taken along the line B-B. The recognition mark 22 and the solder resist layer 30A are formed on the insulating layer 12A (12). First of all, the planar shape of the recognition mark 22 is, for example, circular. The through-hole 32 is formed such that the diameter of the planar shape of the through-hole 32 is larger than the diameter of the planar shape of the circuit pattern 20A2 in order to expose the entire upper surface of the circuit pattern 20A2. Specifically, the area of opening of the planar shape of the through-hole 32 is larger than the area of opening of the recognition mark 22 and the planar shape of the through-hole 32 is variant. Note that the circuit pattern 20A2 can be formed into a plane circular shape easily by, for example, photolithography, or the like.

An inner wall surface of the through-hole 32 is formed by the solder resist layer 30A that is separated from a side wall surface of the recognition mark 22. In other words, the surrounding of the recognition mark 22 is separated from the solder resist layer 30A. The through-hole 32 includes a first through-hole 32A and a second through-hole 32B. The first through-hole 32A is a through-hole of which planar shape is circular and that penetrates the solder resist layer 30A in a direction of the thickness of the solder resist layer 30A such that the entire upper surface of the recognition mark 22 is exposed. The second through-hole 32B is a through-hole of which planar shape is semi-circular and that penetrates part of the solder resist layer 30A on an inner side wall surface of the first through-hole 32A in the direction of the thickness of the solder resist layer 30A. The circular first through-hole 32A and the semi-circular second through-hole 32B form the through-hole 32 of which planar shape is variant. The planar shape of the through-hole 32 is, in other words, a shape obtained by providing the second through-hole 32B as a counterbore in part of the inner wall surface of the circular first through-hole 32A and the first through-hole 32A and the second through-hole 32B are formed continuously. Furthermore, the circular recognition mark 22 is formed in the first through-hole 32A in the through-hole 32.

As illustrated in FIG. 3, the pads 21B are formed by exposing part of the circuit pattern 20B from openings 31B of the solder resist layer 30B that is formed on the lower surface side of the board body 10.

The semiconductor chip 3 is joined to the mount area CA on the circuit board 2 configured as described above by flip chip bonding. In other words, the semiconductor chip 3 is electrically connected to the pads 21A in the chip mount area CA via the bumps 3A that are arranged on the circuit formation surface. Note that, after the bumps 3A of the semiconductor chip 3 are mounted on the pads 21A in the openings 31A of the solder resist layer 30A, solder is fused by heating once and the openings 31A of the solder resist layer 30A are filled with the solder.

Furthermore, the under fill resin 4 is provided to fill the gap between the circuit board 2 and the semiconductor chip 3. The under fill resin 4 is a resin for increasing strength of connection of the joint between the bumps 3A and the pads 21A and inhibiting occurrence of corrosion or electro migration to prevent reliability of the circuit pattern 20A1 from lowering. For example, epoxy resin is usable as a material of the under fill resin 4.

Figure 5:
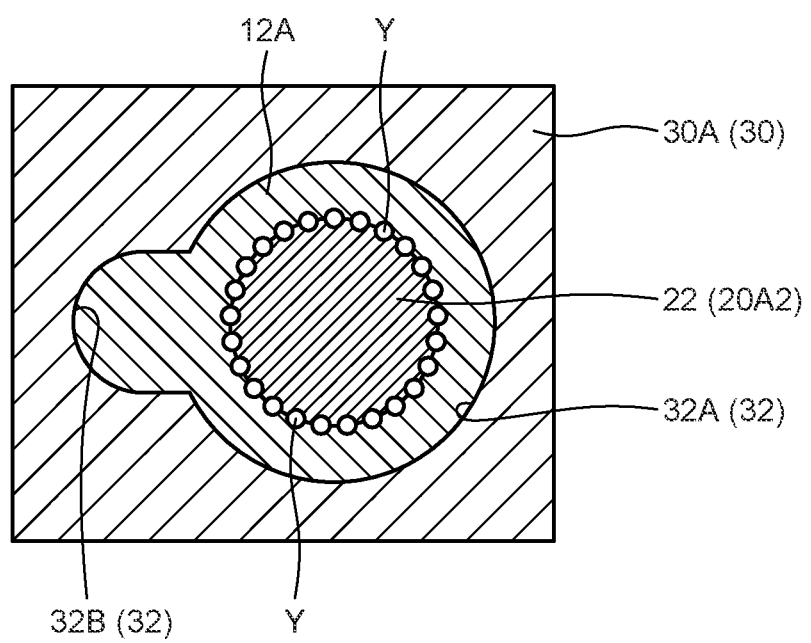
FIG. 5 is an illustrative view illustrating an example of an operation of recognizing border points of the recognition mark.

FIG. 5 is an illustrative view illustrating an example of an operation of recognizing border points Y of the recognition mark 22. The mount device not illustrated in the drawings, for example, applies light with constant intensity to the surface of the recognition mark 22, the solder resist layer 30A, etc., on the circuit board 2 and recognizes the through-hole 32 in the variant shape according to the intensity of the light that is reflected. Furthermore, after recognizing the through-hole 32 in the variant shape, the mount device recognizes the border points Y between the recognition mark 22 in the through-hole 32 and the insulating layer 12A. Accordingly, the contour (shape) of the recognition mark 22 in the through-hole 32 is easily recognized.

Figure 6:
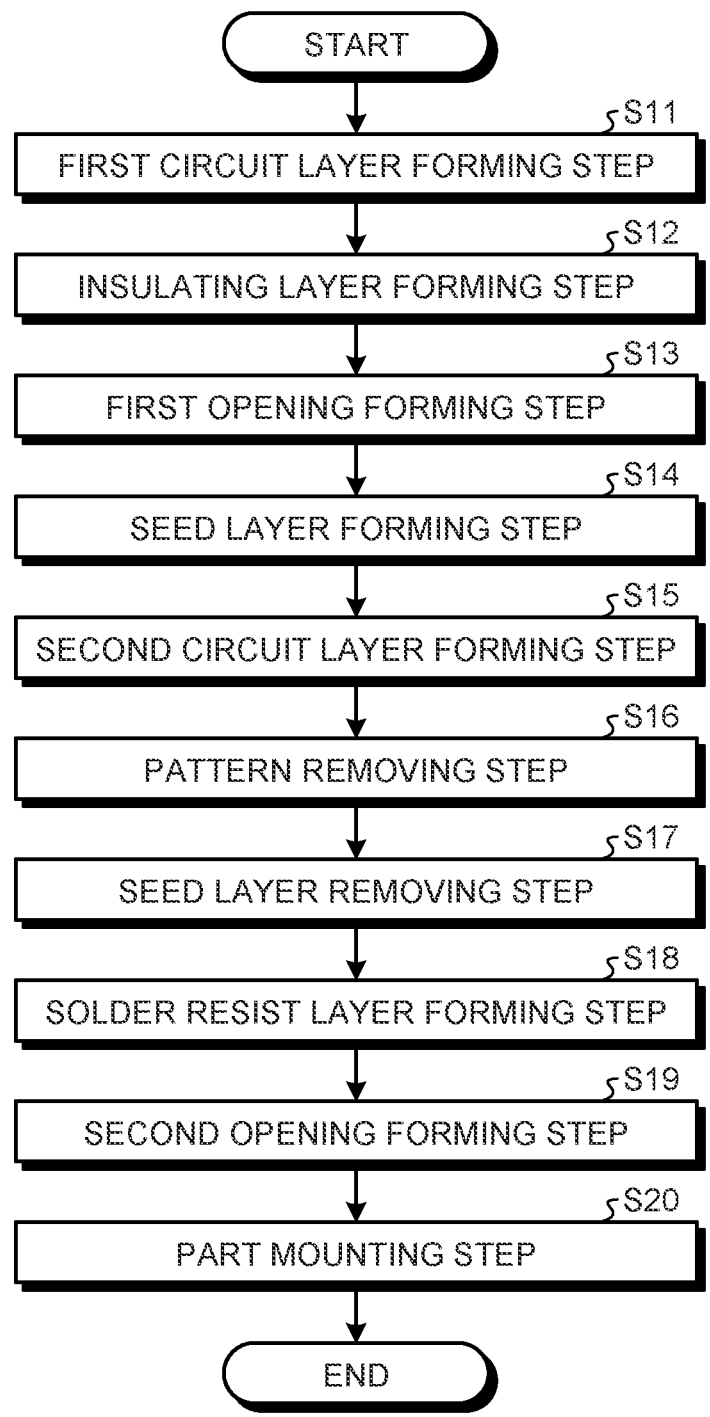
FIG. 6 is a flowchart illustrating an example of a procedure of a process of manufacturing the semiconductor device.

A method of manufacturing the semiconductor device 1 configured as described above will be described. FIG. 6 is a flowchart illustrating an example of a procedure of a process of manufacturing the semiconductor device 1. According to FIG. 6, in the process of manufacturing the semiconductor device 1, a first circuit layer forming step of forming interconnects 13 (13A, 13B) on the core substrate 11 is executed (step S11). In the manufacturing process, after the first circuit layer forming step is executed, an insulating layer forming step of forming the insulating layers 12 (12A, 12B) on the core substrate 11 is executed (step S12).

Furthermore, in the manufacturing process, after the insulating layer forming step is executed, a first opening forming step of forming openings 12A1 and 12B1 in the insulating layers 12 (12A, 12B) is executed (step S13). In the manufacturing process, after the first opening forming step is executed, a seed layer forming step of forming a seed layer S1 (S2) on the insulating layer 12 (12A, 12B) is executed (step S14).

Furthermore, in the manufacturing process, after the seed layer forming step is executed, a plating resist pattern for forming the circuit pattern 20 (20A, 20B) is formed on the seed layer S1 (S2). Furthermore, in the manufacturing process, after the plating resist pattern is formed, a second circuit layer forming step of forming an electroplating that forms the circuit pattern 20 is executed (step S15). In the manufacturing process, after the second circuit layer forming step is executed, a pattern removing step of removing the plating resist pattern that is formed on the seed layer S1 (S2) is executed (step S16).

Furthermore, in the manufacturing process, after the pattern removing step is executed, a seed layer removing step of removing the seed layer S1 (S2) unnecessary on the insulating layer 12 is executed (step S17). Furthermore, in the manufacturing process, after the seed layer removing step is executed, a solder resist layer forming step of forming solder resist layers 30 (30A, 30B) on the insulating layers 12 such that the solder resist layers 30 cover the surfaces of the circuit patterns 20 is executed (step S18). Furthermore, in the manufacturing step, after the solder resist layer forming step is executed, a second opening forming step of forming the openings 31A (31B) and the through-holes 32 in the solder resist layers 30 is executed (step S19).

In the manufacturing process, after the second opening forming step is executed, the recognition marks 22 around the chip mount area CA are identified using the mount device and the position of the chip mount area CA, for example, the middle between the recognition marks is identified. Based on the identified position of the chip mount area CA, a part mounting step of mounting the semiconductor chip 3 on the chip mount area CA is executed (step S20). Thus, the semiconductor device 1 is completed.

Figure 7A:
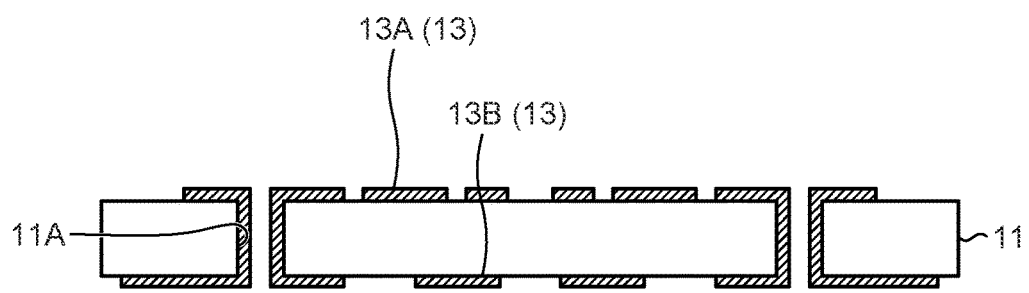
FIG. 7A is an illustrative view illustrating an example of a first circuit layer forming step.

The method of manufacturing the semiconductor device 1 will be described in detail. FIG. 7A is an illustrative view illustrating an example of the first circuit layer forming step. As for the core substrate 11 illustrated in FIG. 7A, for example, through-holes 11A are formed in a copper clad laminated (CCL) and plating is performed on side surfaces of the through-holes 11A, which enables conduction between both surfaces of the core substrate 11. Furthermore, the core substrate 11 is manufactured by forming the interconnects 13A and 13B by a subtractive process.

Figure 7B:
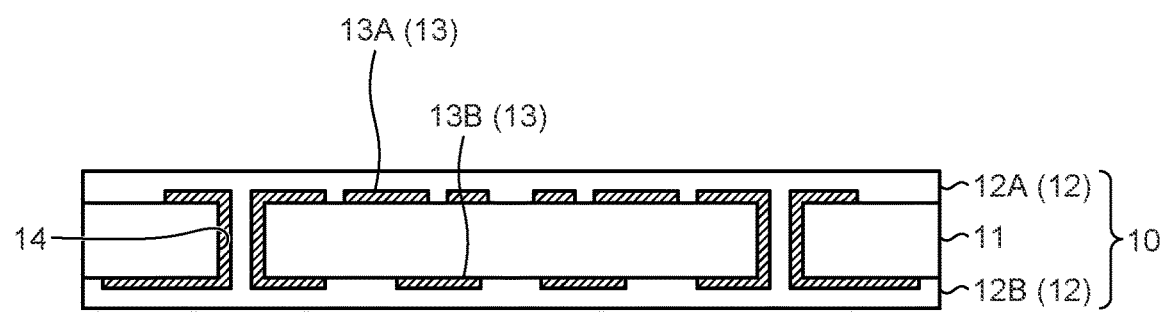
FIG. 7B is an illustrative view illustrating an example of an insulating layer forming step.
Figure 7C:
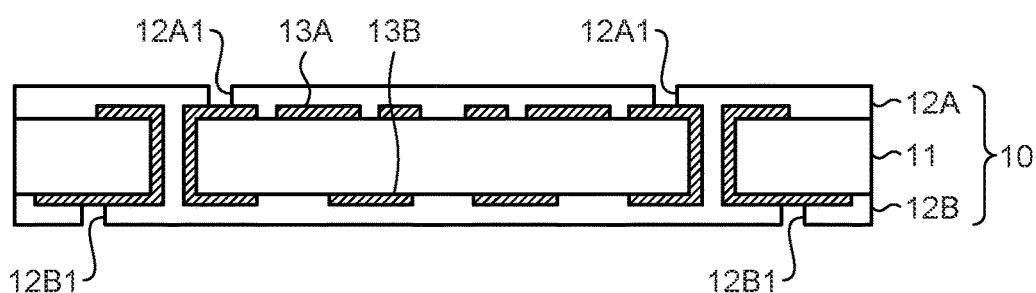
FIG. 7C is an illustrative view illustrating an example of a first opening forming step.

FIG. 7B is an illustrative view illustrating an example of the insulating layer forming step. As illustrated in FIG. 7B, the insulating layers 12A and 12B are formed on both the surfaces of the core substrate 11. FIG. 7C is an illustrative view illustrating an example of the first opening forming step. As illustrated in FIG. 7C, openings 12A1 and 12B1 are formed in predetermined spots on the insulating layers 12A and 12B by, for example, laser such that ends of the interconnects 13A and 13B are exposed.

Figure 7D:
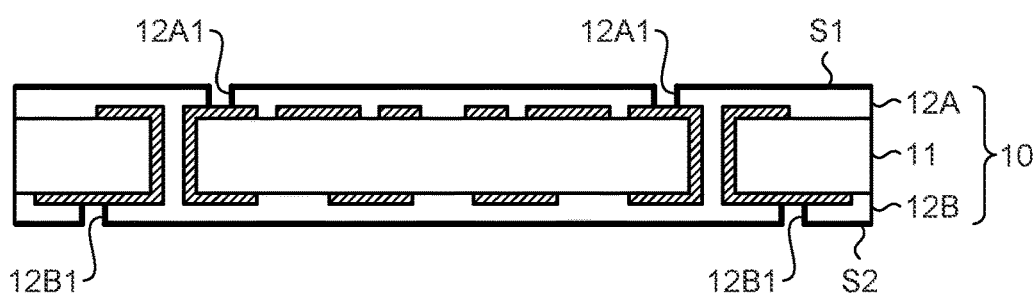
FIG. 7D is an illustrative view illustrating an example of a seed layer forming step.

FIG. 7D is an illustrative view illustrating an example of the seed layer forming step. After desmearing, as illustrated in FIG. 7D, the seed layer S1 is formed such that the seed layer S1 covers the insulating layer 12A and the interconnect 13A and the seed layer S2 is formed such that the seed layer S2 covers the insulating layer 12B and the interconnect 13B. The seed layers S1 and S2 are formed by, for example, electroless copper plating or sputtering.

Figure 8A:
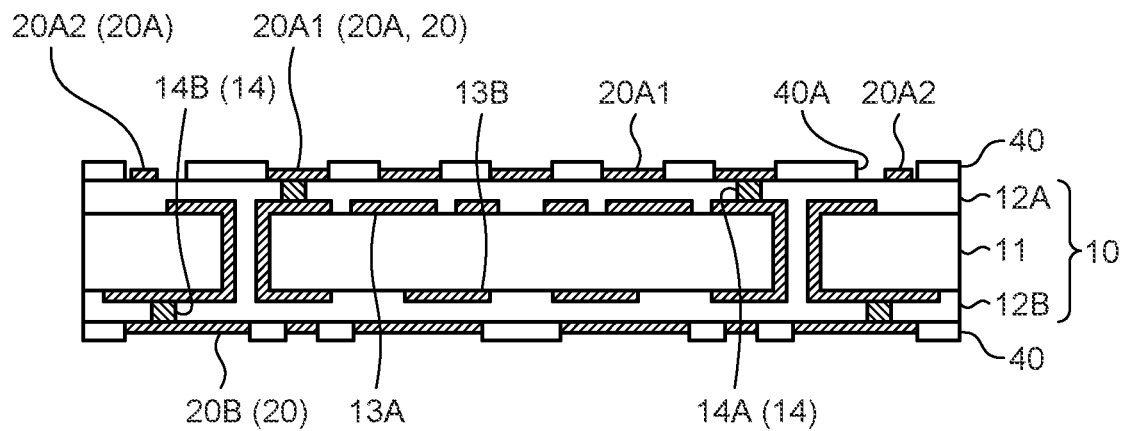
FIG. 8A is an illustrative view illustrating an example of a second circuit layer forming step.

FIG. 8A is an illustrative view illustrating an example of the second circuit layer forming step. As illustrated in FIG. 8A, for example, the circuit patterns 20 and the vias 14 are formed by a semi-additive process. In other words, a dry film resist (DFR) 40 with an opening pattern 40A corresponding to the shape of the circuit pattern 20A is formed on the seed layer S1 by photolithography. Furthermore, the circuit pattern 20 and the vias 14A are formed by copper electroplating using the seed layer S1 as a power supply layer. Accordingly, the circuit pattern 20A1 (the pad 21A) in a desired shape (a circular shape in this example) and the circuit pattern 20A2 (the recognition mark 22) in a desired shape (a circular shape in this example) are formed. In this case, because, as illustrated in FIG. 8A, the opening pattern 40A of the DFR 40 that determines the shape of the circuit pattern 20A is formed by photolithography, it is possible to accurately form the opening pattern 40A corresponding to the circular shape of the circuit pattern 20A. Accordingly, as illustrated in FIG. 8A, it is possible to form the circular circuit pattern 20A accurately. Note that the circuit patter 20B and the vias 14B are formed in the same manner as that in which the circuit pattern 20A and the vias 14A are formed.

Figure 8B:
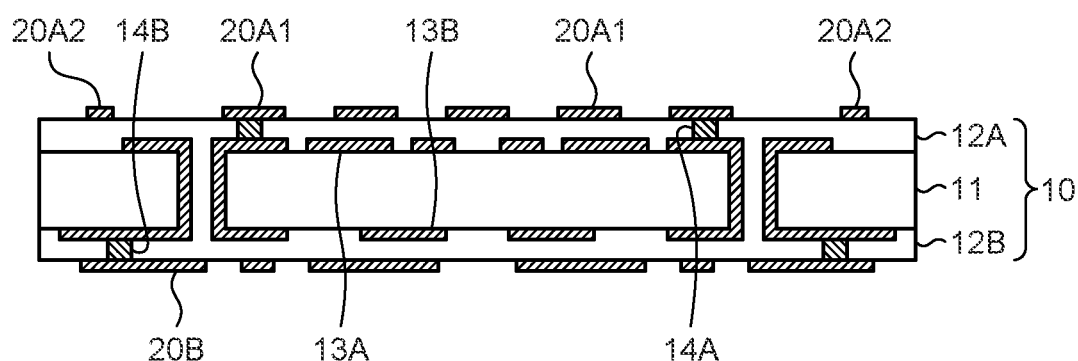
FIG. 8B is an illustrative view illustrating an example of a pattern removing step.
Figure 8C:
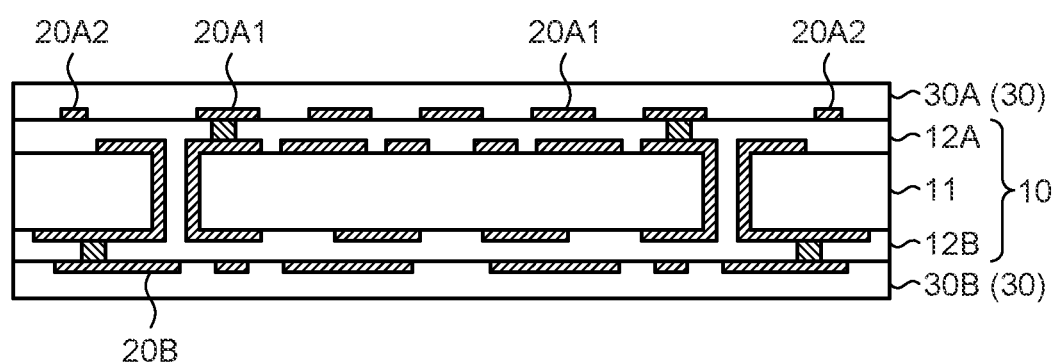
FIG. 8C is an illustrative view illustrating an example of a solder resist layer forming step.

FIG. 8B is an illustrative view illustrating an example of the pattern removing step. When the circuit patterns 20 and the vias 14 are formed as illustrated in FIG. 8A, the seed layers S1 and S2 that are unnecessary are removed from the insulating layers 12 as illustrated in FIG. 8B. FIG. 8C is an illustrative view illustrating an example of the solder resist layer forming step. As illustrated in FIG. 8C, the solder resist layer 30A is formed such that the solder resist layer 30A covers the circuit pattern 20A that is formed on the insulating layer 12A and the solder resist layer 30B is formed such that the solder resist layer 30B covers the circuit pattern 20B that is formed on the insulating layer 12B. When a liquid resist is used, these solder resist layers 30A and 30B can be formed by a process, such as screen printing, spray coating, or roll coating. Laminating the upper surface and the lower surface of the insulating layers 12 with the solder resist layers 30 in a film form enables formation of the solder resist layers 30A and 30B, too.

Figure 9A:
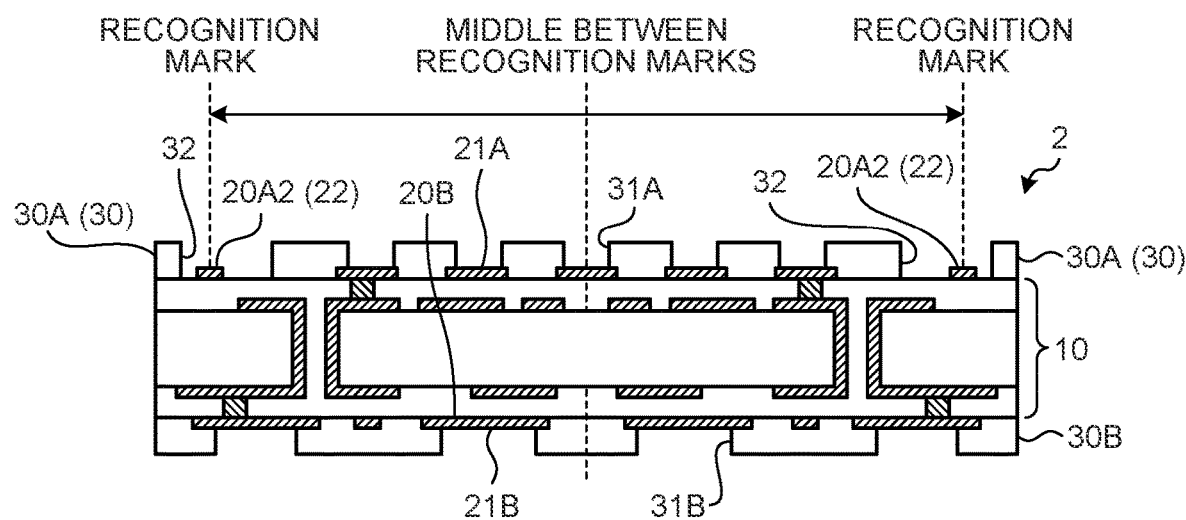
FIG. 9A is an illustrative view illustrating an example of a second opening forming step.

9A is an illustrative view illustrating an example of the second opening forming step. As illustrated in FIG. 9A, the openings 31A and the through-holes 32 that penetrate in the direction of the thickness of the solder resist layer 30A are formed in regions in the solder resist layer 30A corresponding to the pads 21A (the circuit pattern 20A1) and the recognition marks 22 (the circuit pattern 20A2) by laser processing. Furthermore, the openings 31B that penetrate in the direction of the thickness of the solder resist layer 30B are formed in regions in the solder resist layer 30B corresponding to the pads 21B by laser processing. Note that the second opening forming step includes a first through-hole forming step and a second through-hole forming step. In the first through-hole forming step, the first through-hole 32A of which planar shape is circular and that penetrates in the thickness direction of the solder resist layer 30A such that the entire upper surface of the circuit pattern 20A2 is exposed is formed in the solder resist layer 30A. In the second through-hole forming step, the second through-hole 32B that penetrates the solder resist layer 30A serving as part of the inner wall surface of the first through-hole 32A in the thickness direction is formed in the solder resist layer 30A.

Figure 9B:
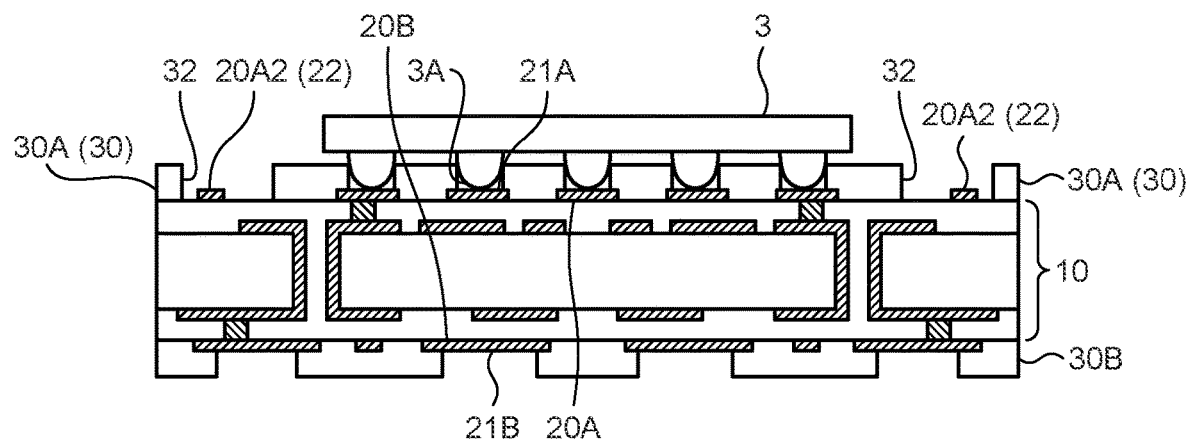
FIG. 9B is an illustrative view illustrating an example of a part mounting step.
Figure 9C:
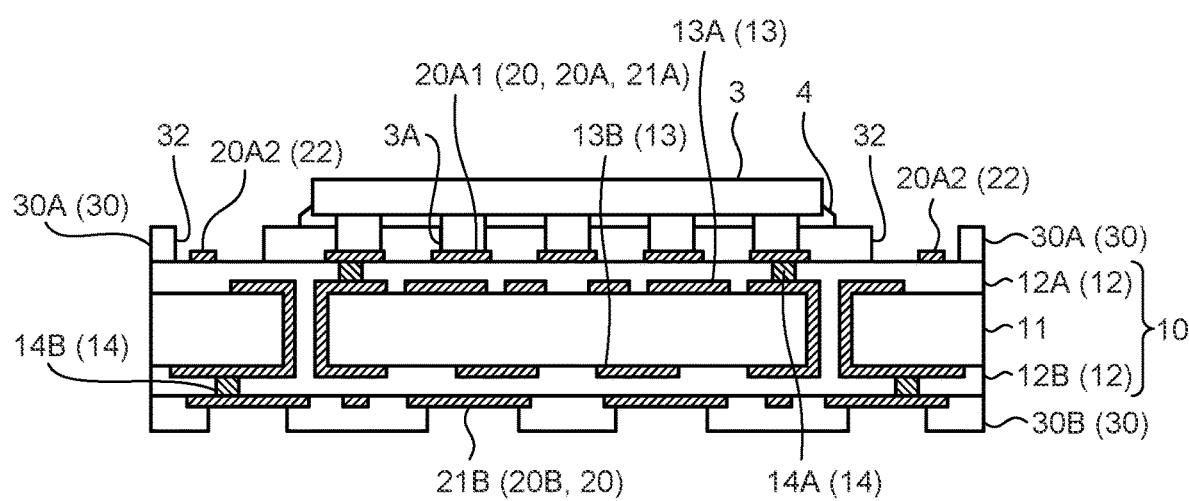
FIG. 9C is an illustrative view illustrating an example of the semiconductor device that is a finished product.

FIG. 9B is an illustrative view illustrating an example of the part mounting step. The mount device identifies the through-holes 32 at two spots around the chip mount area CA on the circuit board 2 and identifies the border points Y between the recognition mark 22 in the identified through-holes 32 and the insulating layer 12A. Furthermore, based on the border points Y, the mount device recognizes the contour of the recognition mark 22 and calculates the center of the recognition mark 22 from the result of the recognition. Based on the calculated centers of the recognition marks 22 at the two spots, the mount device identifies the position of the chip mount area CA. Based on the position of the chip mount area CA, the mount device joins the bumps 3A of the semiconductor chip 3 onto the pads 21A in the chip mount area CA of the circuit board 2 by flip chip bonding as illustrated in FIG. 9B. In other words, after the bumps 3A of the semiconductor chip 3 are mounted on the pads 21A in the openings 31A of the solder resist layer 30A, solder is fused once by heating and the openings 31A of the solder resist layer 30A are filled with the solder. FIG. 9C is an illustrative view illustrating an example of the semiconductor device 1 that is a finished product. The space between the semiconductor chip 3 and the circuit board 2 that are joined by flip chip bonding is filled with the under fill resin 4 and the under fill resin is cured. Accordingly, the semiconductor device 1 that is a finished product can be manufactured as illustrated in FIG. 9C.

Figure 10:
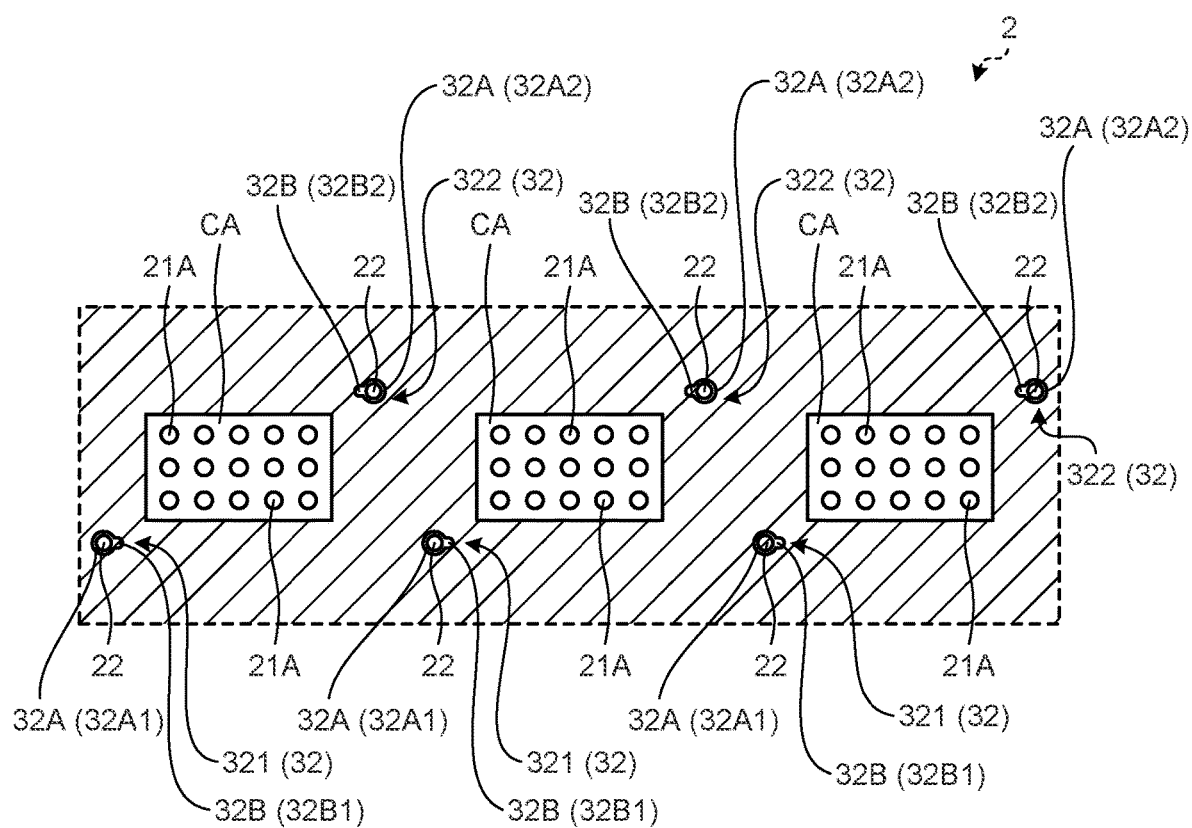
FIG. 10 is a schematic plan view illustrating an example of a plurality of circuit boards.

FIG. 10 is a schematic plan view illustrating an example of a plurality of the circuit boards 2. On a board, a plurality of chip mount areas CA of which planar shape is rectangular and on each of which the semiconductor chip 3 is to be mounted are arranged vertically and horizontally. With respect to each of the chip mount areas CA, one through-hole 321 (32) and another through-hole 322 (32) are arranged oppositely in portions outside the chip mount area CA on an approximately diagonal line of the chip mount area CA. In other words, the one through-hole 321 and the another through-hole 322 have a relationship of point symmetry with respect to the chip mount area CA serving as the center. The one through-hole 321 includes one first through-hole 32A1 and one second through-hole 32B1 that is formed in a first position (on the right in the drawing) on an inner wall surface of the one first through hole 32A1. In other words, the one second through-hole 32B1 is formed in the inner wall surface (the first position) of the one first through-hole 32A1 on the right in the drawing. The another through-hole 322 includes another first through-hole 32A2 and another second through-hole 32B2 that is formed in a second position (on the left in the drawing) different from the first position on an inner wall surface of the another first through hole 32A2. In other words, the another second through-hole 32B2 is formed in the inner wall surface (the second position) of the another first through-hole 32A2 on the left in the drawing.

Focusing on the position in which the second through-hole 32B is formed with respect to the first through-hole 32A, the mount device identifies the one second through-hole 32B1 in the first position and the another second through-hole 32B2 in the second position. The mount device is able to identify the one through-hole 321 and the another through-hole 322 in a pair per chip mount area CA by identifying the one second through-hole 32B1 and the another second through-hole 32B2. Based on the center of the circular recognition mark 22 in the one through-hole 321 and the center of the circular recognition mark 22 in the another through-hole 322, the mount device identifies the position of the chip mount area CA. As a result, even when the through-holes 32 are adjacent to each other, it is possible to prevent incorrect recognition of the one through-hole 321 and the another through-hole 322 in a pair per chip mount area CA.

The circuit board 2 of the embodiment includes the circuit pattern 20A that is the interconnect of the top layer and the solder resist layer 30A that covers the circuit pattern 20A and the circuit pattern 20A includes the circuit pattern 20A2 that is formed to serve as the recognition mark 22 of which planar shape is circular. The solder resist layer 30A includes the through-hole 32 of which planar shape is variant and that penetrates in the thickness direction of the solder resist layer 30A such that the entire upper surface of the circuit pattern 20A2 is exposed. As a result, because the through-hole 32 is variant, not only the through-hole 32 in the variant shape but also the recognition mark 22 in the through-hole 32 is identified easily and thus it is possible to provide the recognition mark 22 that is highly recognizable.

Furthermore, even when the through-hole 32 shifts with respect to the circuit pattern 20A, because the planar shape of the through-hole 32 is variant, it is possible to identify the recognition mark 22 in the through-hole 32. Even when the recognition mark 22 and the pad 21A are in the same circular shape, the through-hole 32 is recognized and this enables prevention of incorrect recognition of the recognition mark 22.

Furthermore, the through-hole 32 includes the first through-hole 32A and the second through-hole 32B. The first through-hole 32A is a through-hole of which planar shape is circular and that penetrates the solder resist layer 30A in the thickness direction such that the entire upper surface of the circuit pattern 20A2 is exposed. The second through-hole 32B is a through-hole that serves as part of the inner wall surface of the first through-hole 32A and that penetrates the solder resist layer 30A in the thickness direction. As a result, it is possible to easily form the through-hole 32 in the variant shape using the first through-hole 32A and the second through-hole 32B.

The planar shapes of the first through-hole 32A and the circuit pattern 20A2 are circular and the diameter of the first through-hole 32A is larger than the diameter of the circuit pattern 20A2. Furthermore, the circuit pattern 20A2 is arranged in the first through-hole 32A such that the inner wall surface in the first through-hole 32A and the side wall of the circuit pattern 20A2 do not make contact with each other. As a result, even when the planar shapes of the recognition mark 22 and the pad 21A are circular, it is possible to identify the circular recognition mark 22 using the through-hole 32 in the variant shape.

The circuit pattern 20A contains the circuit pattern 20A1 that is at least partly exposed from the solder resist layer 30A as the pads 21A and the circuit pattern 20A1 and the circuit pattern 20A2 are formed in the same thickness. As a result, it is possible to form the circuit pattern 20A1 and the circuit pattern 20A2 in the same step at a time (see FIG. 8A) and furthermore it is possible to form the pads 21A and the recognition marks 22 in the same step (see FIG. 9A).

The planar shape of the recognition mark 22 is exemplified as the circular shape; however, the planar shape of the recognition mark 22 is not limited to the circular shape and the planar shape may be an approximately circular shape, a shape with a corner or a variant shape and may be changed as appropriate.

Figure 11A:
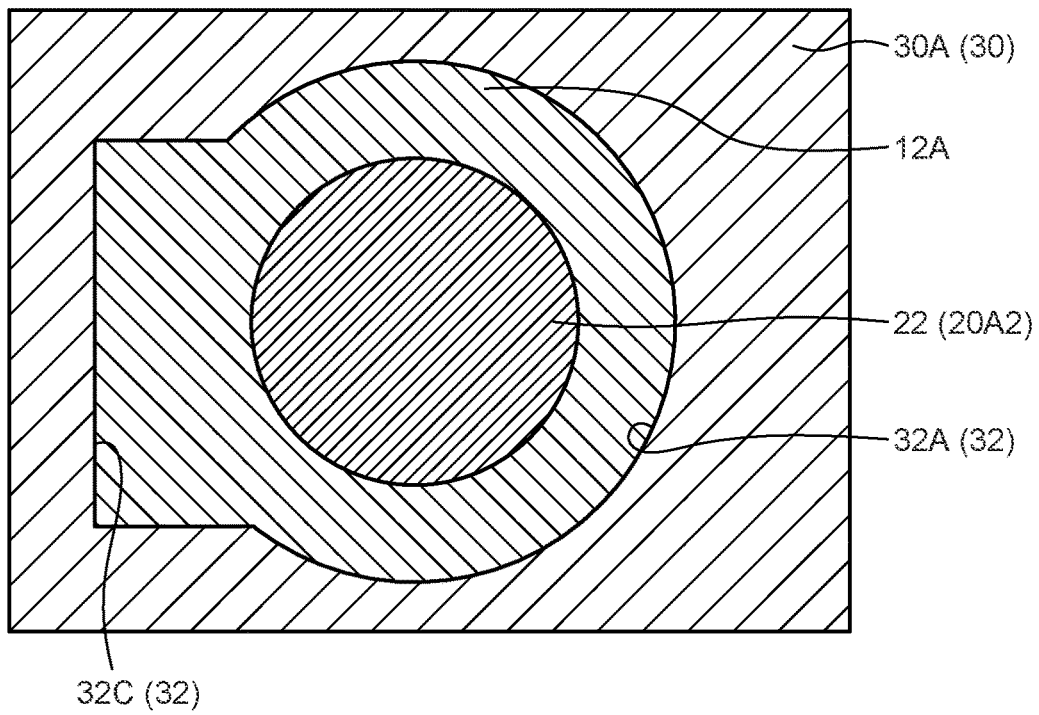
FIG. 11A is a schematic plan view illustrating an example of the recognition mark and a through-hole.

The case in which the through-hole 32 is formed by the first through-hole 32A of which planar shape is circular and the second through-hole 32B of which planar shape is semi-circular is exemplified; however, the configuration is not limited thereto. The planar shape of the second through-hole 32B may be the shapes illustrated in FIG. 11A to FIG. 11D and may be changed as appropriate. FIG. 11A is a schematic plan view illustrating an example of the recognition mark 22 and the through-hole 32. Note that the planer shape of the recognition mark 22 is circular and the planar shape of the first through-hole 32A is circular. The second through-hole 32B of which planar shape is semi-circular may be replaced with a second through-hole 32C of which planar shape is rectangular as illustrated in FIG. 11A.

Figure 11B:
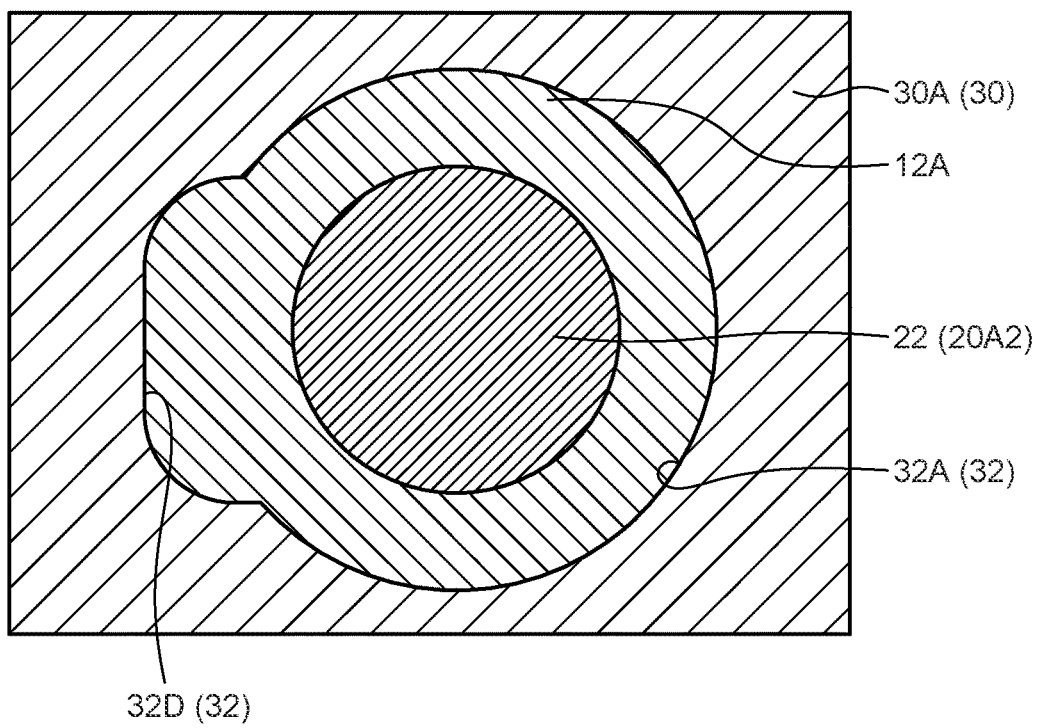
FIG. 11B is a schematic plan view illustrating an example of the recognition mark and the through-hole.

FIG. 11B is a schematic plan view illustrating an example of the recognition mark 22 and the through-hole 32. Note that the planar shape of the recognition mark 22 is circular and the planar shape of the first through-hole 32A is circular. The second through-hole 32B of which planar shape is semi-circular may be replaced with a second through-hole 32D of which planar shape is long semi-circular as illustrated in FIG. 11B.

Figure 11C:
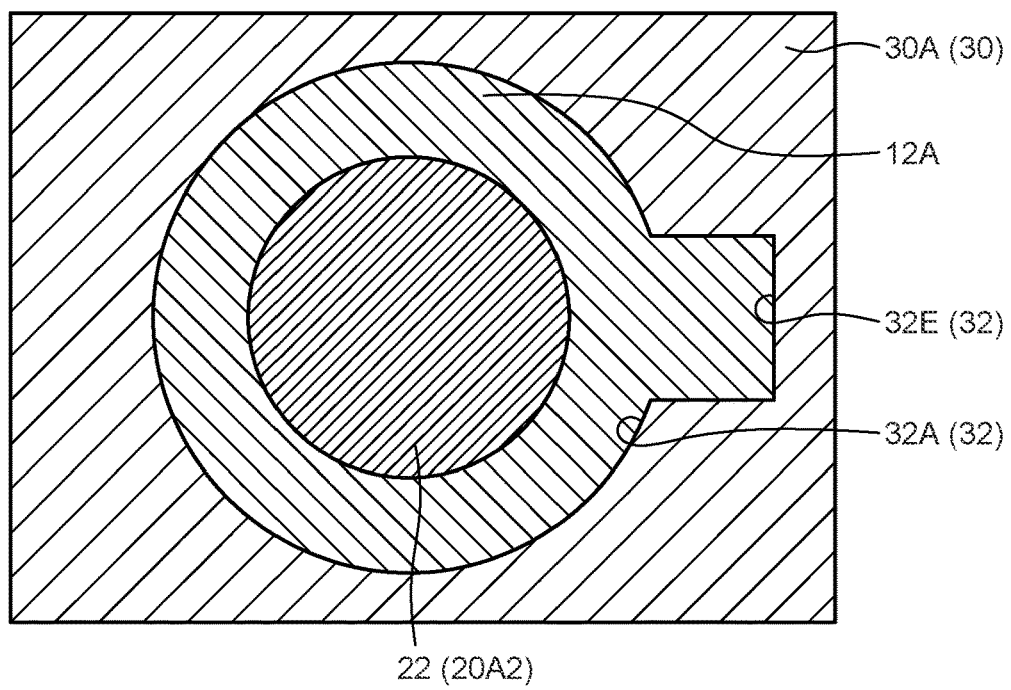
FIG. 11C is a schematic plan view illustrating an example of the recognition mark and the through-hole.

FIG. 11C is a schematic plan view illustrating an example of the recognition mark 22 and the through-hole 32. Note that the planar shape of the recognition mark 22 is circular and the planar shape of the through-hole 32 is circular. The second through-hole 32B of which planar shape is semi-circular may be replaced with a second through-hole 32E of which planar shape is square as illustrated in FIG. 11C.

Figure 11D:
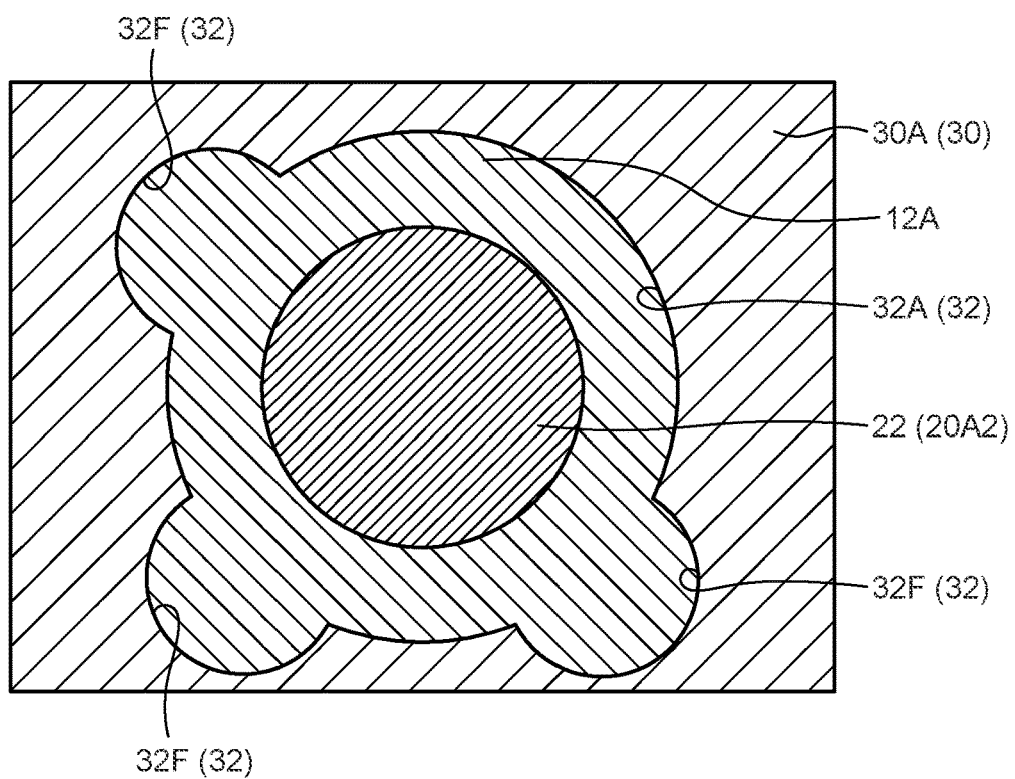
FIG. 11D is a schematic plan view illustrating an example of the recognition mark and the through-hole.
Figure 12:
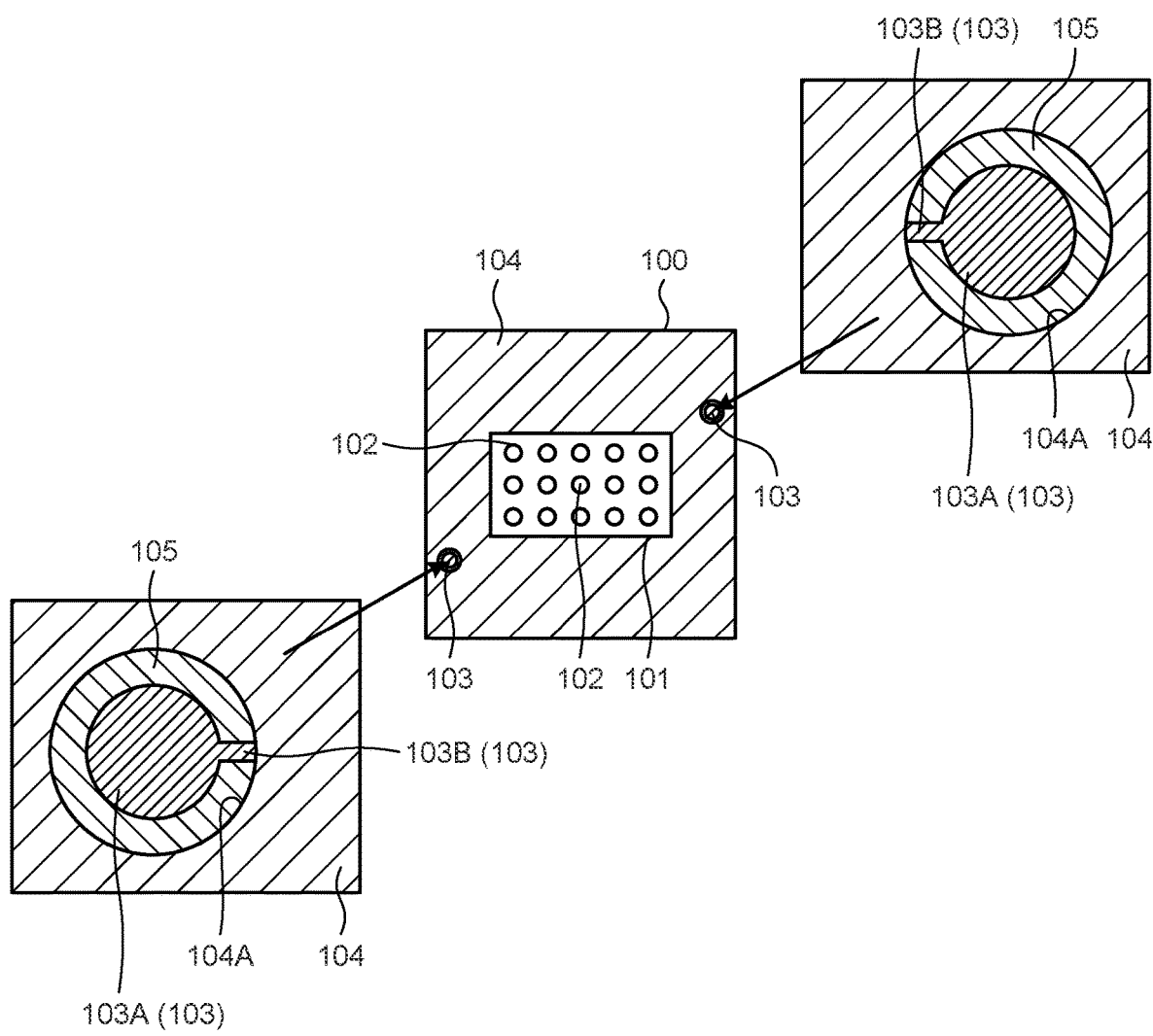
FIG. 12 is a schematic plan view illustrating an example of a conventional circuit board and a conventional recognition mark.
Figure 13:
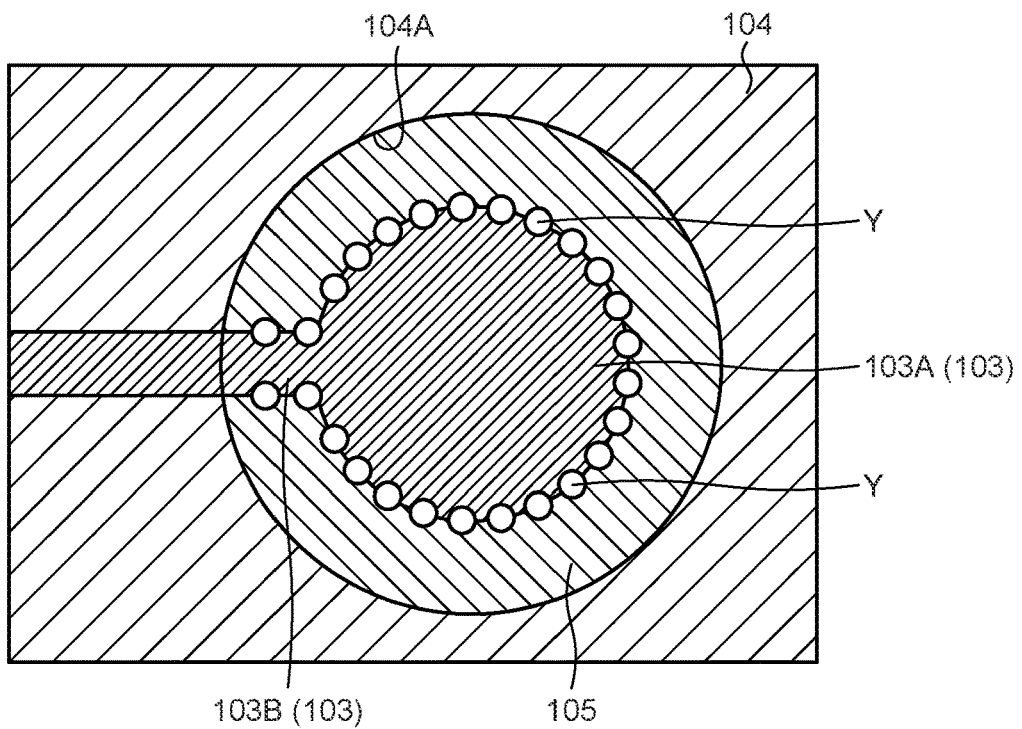
FIG. 13 is an illustrative view illustrating an example of an operation of recognizing border points of the conventional recognition mark.
Figure 14:
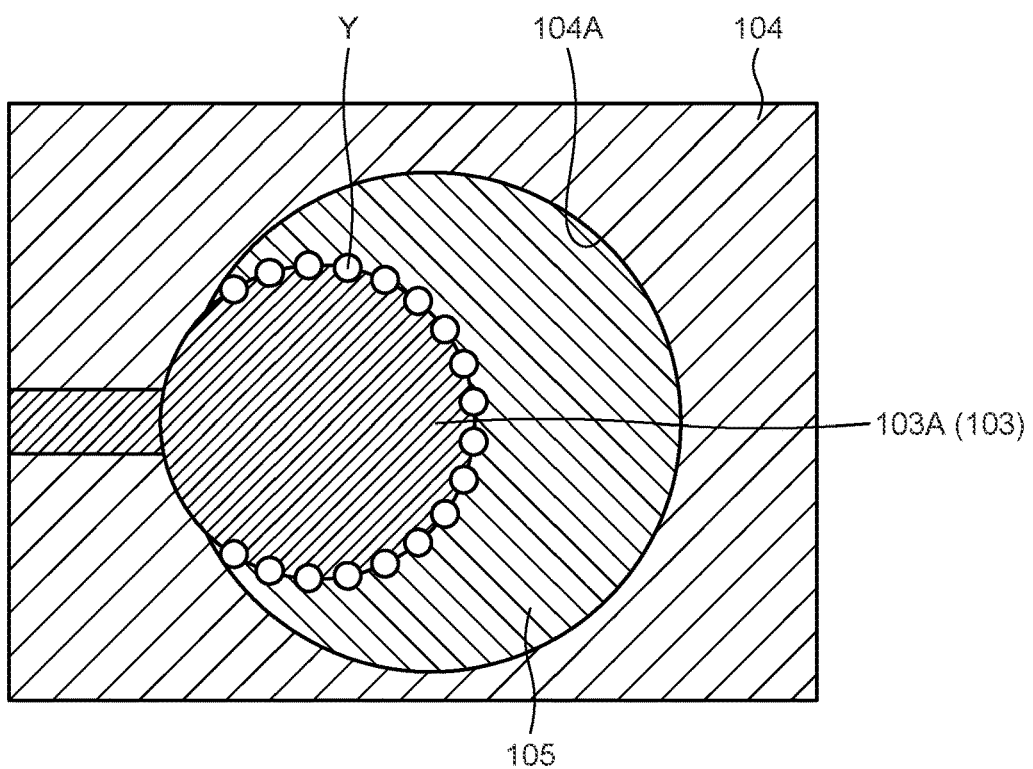
FIG. 14 is an illustrative view illustrating an example of a problem in an operation of recognizing the conventional recognition mark.
Figure 15A:
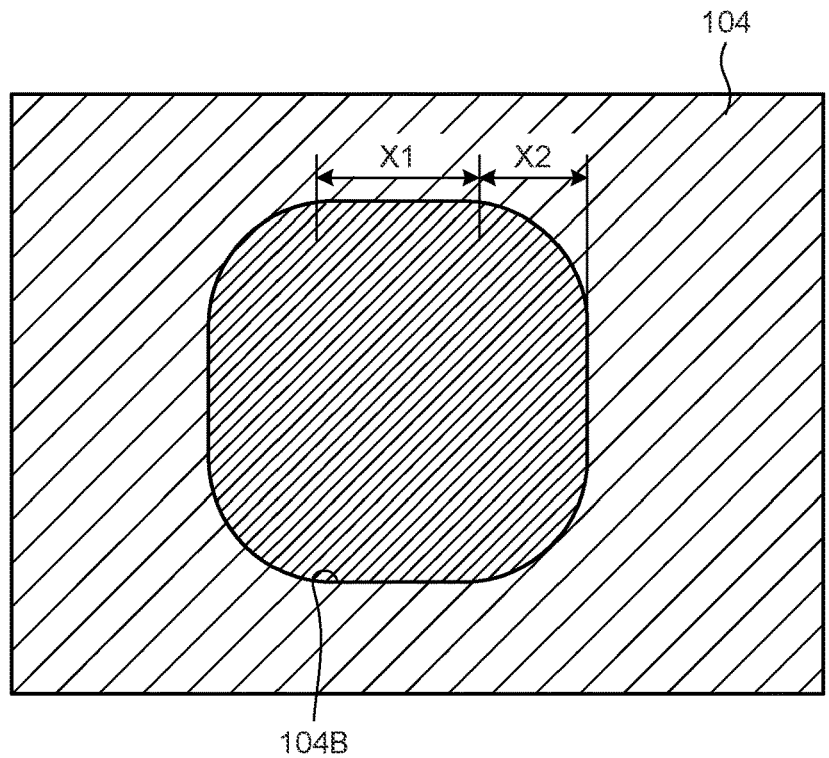
FIG. 15A is a schematic plan view illustrating an example of a conventional opening.
Figure 15B:
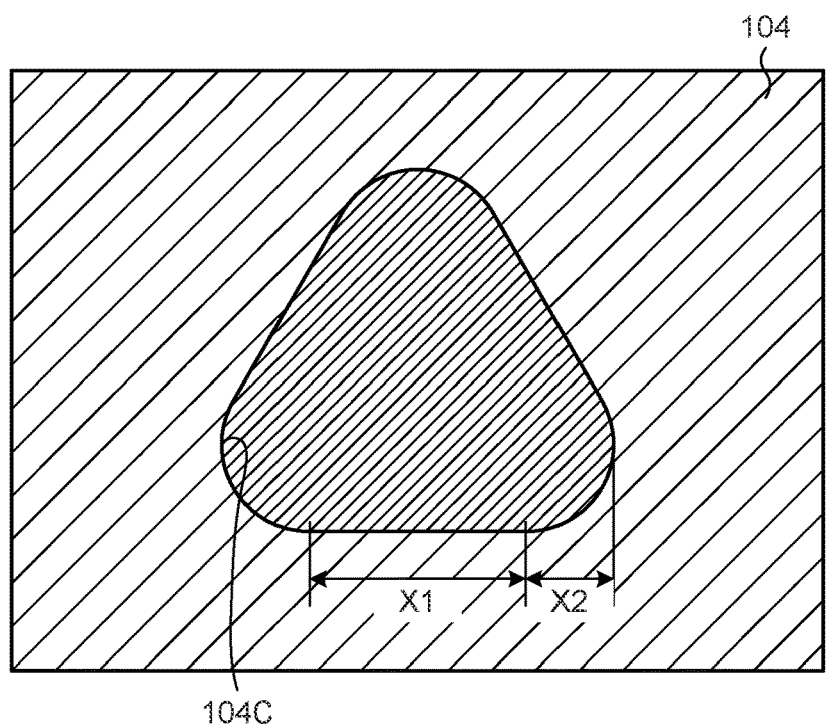
FIG. 15B is a schematic plan view illustrating an example of a conventional opening.

FIG. 11D is a schematic plan view illustrating an example of the recognition mark 22 and the through-hole 32. Note that the planar shape of the recognition mark 22 is circular and the planar shape of the through-hole 32 is circular. Not only one but a plurality of the second through-holes 32B of which planar shape is semi-circular may be used. The single second through-hole 32B may be replaced with three semi-circular second through-hole 32F.

For example, when the recognition mark 22 is detected according to the intensity of light reflected on the surface of the recognition mark 22, etc., the difference in intensity of reflected light between the recognition mark 22 and the insulating layer 12A can be increased. As a result, the border between the recognition mark 22 and the insulating layer 12A, that is, the contour of the recognition mark 22 is enhanced and thus it is possible to increase recognizability of the recognition mark 22.

The recognition mark 22 is arranged on the insulating layer 12A in the through-hole 32 such that the inner side wall surface of the through-hole 32 and the side wall surface of the recognition mark 22 separate from each other and accordingly the contour of the recognition mark 22 is enhanced and thus the recognition mark 22 can be recognized easily.

The circuit board 2 including the pads 21A that are provided in a matrix has been described as the circuit board 2 of the embodiment, and a circuit board including pads that are arranged peripherally may be used.

As for the second opening forming step, the case in which, when the through-holes 32 are formed, after the first through-hole 32A is formed in the first through-hole forming step, the second through-hole 32B is formed in the inner wall surface of the first through-hole 32A in the second through-hole forming step is exemplified. The first through-hole forming step however may be executed after the second through-hole forming step is executed. The through-holes 32 serving as the first through-hole 32A and the second through-hole 32B may be formed collectively without individually executing the first through-hole forming step and the second through-hole forming step, and changes can be made as appropriate.

As for the solder resist layer 30, for example, the case where insulting and non-photosensitive resin, such as epoxy resin, is used is exemplified. In this case, laser processing is exemplified as the method of forming the through-holes 32 and the openings 31A (31B) in the solder resist layer 30. For the solder resist layer 30, however, for example, insulating photosensitive resin, such as acryl resin and polyimide resin, may be used. In this case, the through-holes 32 and the openings 31A (31B) may be formed in the solder resist layer 30 by exposure and development, and changes can be made as appropriate. For example, the through-holes 32 and the openings 31A (31B) may be formed in the solder resist layer 30 by sand blasting, wet blasting or resin etching, and changes can be made as appropriate.

The shape of the opening 31A for forming the pad 21A in the embodiment is circular; however, the shape is not limited to this. Furthermore, for example, the opening 31A may be formed such that not part of the surface but the entire surface of the circuit pattern 21A1 is exposed as the pad 21A.

In the embodiment, the case where the recognition marks 22 of the circuit board 2 are identified and the semiconductor chip 3 is mounted on the chip mount area CA is described; however, what to be mounted is not limited to the semiconductor chip 3. The semiconductor chip 3 may be replaced with, for example, a flip chip mount package (package on package) with a configuration in which another circuit board is superimposed in a predetermined area in the circuit board 2 using the recognition marks 22, and changes can be made as appropriate.

In the embodiment, the configuration of the layers under the circuit pattern 20A is not particularly limited. The configuration and material of the core substrate 11 is not particularly limited. The number of lower layers of interconnects (for example, the interconnects 13A and 13B) that are formed on the core substrate 11 and of insulating layers (for example, the insulating layers 12A and 12B) covering the interconnects are not particularly limited. In other words, a predetermined number of lower layers of interconnects and insulating layers converting the interconnects may be formed on the core substrate 11. Note that the pattern form of the circuit pattern 20A is not particularly limited.

Not only the core substrate 11 with a core but also various substrates that are generally used, such as a coreless substrate or an embedded trace substrate (ETS) that is formed by embedding interconnects of an outer layer in an insulating layer, may be used.

What to be formed on the circuit pattern 20A (20B) in the embodiment is not limited to the solder resist layer 30 and any insulating layer may be formed.

<Addendum 1> A method of manufacturing a circuit board including a recognition mark that is exposed from an insulating layer, the method comprising:
  forming a first interconnect that serves as the recognition mark of which planar shape is a predetermined shape;
  forming the insulating layer such that the insulting layer covers the first interconnect;
  forming a through-hole of which planar shape is variant and that penetrates the insulating layer in a thickness direction of the insulating layer such that an entire upper surface of the first interconnect is exposed from the insulating layer, wherein the forming the through-hole includes
  forming, in the insulating layer, a first through-hole of which planar shape is a predetermined shape and that penetrates the insulating layer in the thickness direction such that the entire upper surface of the first interconnect is exposed;
  forming, in the insulating layer, a second through-hole that serves as part of an inner wall surface of the first through-hole and that penetrates the insulating layer in the thickness direction; and
  forming the through-hole in the variant shape using the first through-hole and the second-through-hole.

<Addendum 2> The method according to addendum 1, wherein the forming the first interconnect includes forming a second interconnect in the same thickness as that of the first interconnect,
  the forming the insulating layer includes forming the insulating layer such that the insulating layer covers the first interconnect and the second interconnect, and
  the forming the through-hole includes forming a pad by exposing at least part of the second interconnect from the insulating layer by penetrating the insulating layer in an area opposed to the second interconnect in the thickness direction.

According to one mode of a circuit board disclosed herein, using a through-hole in a variant shape that is formed such that the entire upper surface of the recognition mark is exposed makes it possible to provide the recognition mark that is highly recognizable.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A circuit board comprising an interconnect and an insulating layer that covers the interconnect,
   wherein the interconnect includes a first interconnect that is formed to serve as a recognition mark of which planar shape is a predetermined shape,
   the insulating layer has a through-hole of which planar shape is variant and that penetrates the insulating layer in a thickness direction of the insulating layer such that an entire upper surface of the first interconnect is exposed, and
   the through-hole includes
   a first through-hole of which planar shape is a predetermined shape and that penetrates the insulating layer in the thickness direction such that the entire upper surface of the first interconnect is exposed; and
   a second through-hole that serves as part of an inner wall surface of the first through-hole and that penetrates the insulating layer in the thickness direction.

2. The circuit board according to claim 1, wherein the planar shapes of the first through-hole and the first interconnect are circular, and
   a diameter of the first through-hole is larger than a diameter of the first interconnect and the first interconnect is arranged in the first through-hole such that the inner wall surface in the first through-hole does not make contact with a side wall of the first interconnect.

3. The circuit board according to claim 2, wherein the the planar shape of the second through-hole is semi-circular, and the diameter of the first through-hole is larger than the diameter of the second through-hole.

4. The circuit board according to claim 1, wherein a plurality of chip mount areas of which planar shape is rectangular and on each of which a semiconductor chip is mounted are arranged on a substrate in vertical and horizontal directions and, with respect to each of the chip mount areas, one first through-hole and another first through-hole are arranged oppositely in portions outside the chip mount area on an approximately diagonal line of the chip mount area, one second through-hole is formed in a first position on an inner wall surface of the one first through hole, and another second through-hole is formed in a second position on an inner wall surface of the another first through-hole that is different from the first position.

5. The circuit board according to claim 1, wherein the interconnect includes a second interconnect that is at least partly exposed from the insulating layer as a pad, and
   the first interconnect and the second interconnect are formed in the same thickness.

6. The circuit board according to claim 5, wherein the first interconnect and the second interconnect are in the same size and in the same shape as viewed from above.

7. A semiconductor device comprising an interconnect, an insulating layer that covers the interconnect, and a semiconductor chip,
   wherein the interconnect includes
   a first interconnect that is formed to serve as a recognition mark of which planar shape is a predetermined shape; and
   a second interconnect that serves as a pad to which the semiconductor chip is electrically connected,
   the insulating layer has a through-hole of which planar shape is variant and that penetrates the insulating layer in a thickness direction of the insulating layer such that an entire upper surface of the first interconnect is exposed, and
   the through-hole includes
   a first through-hole of which planar shape is a predetermined shape and that penetrates the insulating layer in the thickness direction such that the entire upper surface of the first interconnect is exposed; and
   a second through-hole that serves as part of an inner wall surface of the first through-hole and that penetrates the insulating layer in the thickness direction.

* * * * *